US012145636B2

(12) United States Patent
McGinn et al.

(10) Patent No.: US 12,145,636 B2
(45) Date of Patent: Nov. 19, 2024

(54) DEVICE, SYSTEM AND METHOD FOR DETECTING LEAKAGE CURRENT FOR TRACTION POWER SYSTEM

(71) Applicant: HATCH LTD., Mississauga (CA)

(72) Inventors: Patrick Henry McGinn, Freelton (CA); Mark James Mitchell, Vancouver (CA); Matthew Douglas Brown, Oakville (CA); Matthew Gorczyca, Toronto (CA); Michael Morgan Campbell, Toronto (CA)

(73) Assignee: Hatch Ltd., Mississauga (CA)

( * ) Notice: Subject to any disclaimer, the term of this patent is extended or adjusted under 35 U.S.C. 154(b) by 0 days.

(21) Appl. No.: 17/917,480

(22) PCT Filed: Apr. 9, 2021

(86) PCT No.: PCT/CA2021/050476
§ 371 (c)(1),
(2) Date: Oct. 6, 2022

(87) PCT Pub. No.: WO2021/203204
PCT Pub. Date: Oct. 14, 2021

(65) Prior Publication Data
US 2023/0084963 A1 Mar. 16, 2023

Related U.S. Application Data

(60) Provisional application No. 63/007,595, filed on Apr. 9, 2020.

(51) Int. Cl.
*B61K 9/08* (2006.01)
*B60M 3/00* (2006.01)
(Continued)

(52) U.S. Cl.
CPC ............... *B61K 9/08* (2013.01); *B60M 3/00* (2013.01); *B61D 15/12* (2013.01); *B61L 27/53* (2022.01);
(Continued)

(58) Field of Classification Search
CPC .......... B61D 15/12; B61K 9/08; B61L 27/53; G01R 31/52; G01R 31/008; G01R 31/11;
(Continued)

(56) References Cited

U.S. PATENT DOCUMENTS 2,958,818 A * 11/1960 Cowan ................... B61K 9/08
324/217
5,586,736 A * 12/1996 Mollet .................... B61L 3/221
246/63 R
(Continued)

FOREIGN PATENT DOCUMENTS

CA  2613747 A1  1/2007
CN  111766292 A * 10/2020
(Continued)

OTHER PUBLICATIONS

International Search Report and Written Opinion for International Application No. PCT/CA2021/050476, date of mailing Jul. 2, 2021.
(Continued)

*Primary Examiner* — Zachary L Kuhfuss
(74) *Attorney, Agent, or Firm* — Bordner Ladner Gervais LLP; Brandon Evenson

(57) ABSTRACT

A method, device, and system for detecting a current leak in a traction power rail. Magnetic or electrical properties of the rail are measured. The measurements are performed using a rail instrument that senses the properties around the rail at various times while the instrument is being moved down the rail, such as using a cart or train. The rail instrument may be a flux concentrator or open Rogowski coil. The locations of
(Continued)

the rail, about which the readings are taken by the rail instrument, may be determined and correlated with the measurements themselves. The method may comprise measuring the magnetic field of the rail along a length of the rail, and identifying a leak based on differences between the magnetic field measurements. The system may comprise a cart comprising the rail instrument and a location instrument.

17 Claims, 11 Drawing Sheets

(51) Int. Cl.
  *B61D 15/12* (2006.01)
  *B61L 27/53* (2022.01)
  *G01R 31/00* (2006.01)
  *G01R 31/11* (2006.01)
  *G01R 31/52* (2020.01)
  *G01R 33/00* (2006.01)
  *G01R 33/028* (2006.01)
  *G01R 33/04* (2006.01)
  *G01R 33/07* (2006.01)
  *G01R 33/09* (2006.01)

(52) U.S. Cl.
  CPC ............ *G01R 31/008* (2013.01); *G01R 31/11* (2013.01); *G01R 31/52* (2020.01); *G01R 33/0011* (2013.01); *G01R 33/0076* (2013.01); *G01R 33/0286* (2013.01); *G01R 33/04* (2013.01); *G01R 33/072* (2013.01); *G01R 33/091* (2013.01)

(58) Field of Classification Search
  CPC ............ G01R 33/0011; G01R 33/0076; G01R 33/0286; G01R 33/04; G01R 33/072; G01R 33/091; G01R 33/028
  See application file for complete search history.

(56) References Cited

U.S. PATENT DOCUMENTS

| 6,600,999 | B2 | 7/2003 | Clark et al. | |
|---|---|---|---|---|
| 2008/0191705 | A1* | 8/2008 | Bellan | G01R 31/52 |
| | | | | 324/529 |
| 2014/0009299 | A1* | 1/2014 | Fahrenkrug | G01R 31/52 |
| | | | | 340/664 |

FOREIGN PATENT DOCUMENTS

| EP | 3825203 A1 * | 5/2021 | ............... B60L 5/39 |
|---|---|---|---|
| WO | WO-9530878 A1 * | 11/1995 | ............... B61K 9/08 |
| WO | 2017082730 A1 | 5/2017 | |

OTHER PUBLICATIONS

International Preliminary Report on Patentability for International Application No. PCT/CA2021/050476, date of mailing Jun. 21, 2022.

\* cited by examiner

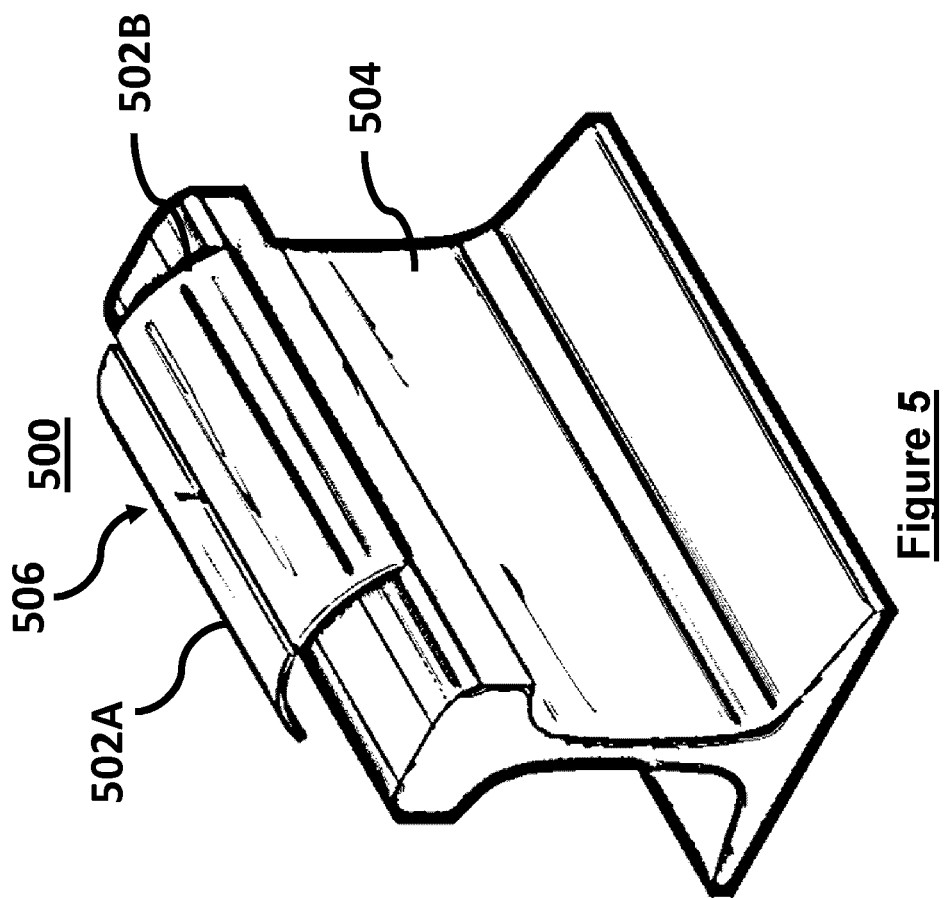

DEVICE, SYSTEM AND METHOD FOR DETECTING LEAKAGE CURRENT FOR TRACTION POWER SYSTEM

FIELD

This present disclosure relates to traction power systems including electric railway systems.

BACKGROUND

Stray currents or current leakage is a common problem in electric railway systems. Current leakage can cause damage to the rail system and surrounding infrastructure. Current leakage can cause corrosion of the rails, nearby metallic infrastructure (such as gas and water pipes or conductors), and metal structures such as concrete reinforcing rods. Current leakage can also result in energy loss.

Conventional procedures that attempt to detect if and where leakage currents exist require personnel to perform testing on track level, walking along the track to perform inspections. In a conventional track testing procedure, a current source at an injection point creates a series of on-off pulses, which are measured at a measurement point further along the track. The strength of an end point pulse is compared with the strength of the corresponding start point pulse, and the measured loss in current is used to infer that there is a leak somewhere along a section of the track being tested, and infer the severity of the leak. There are significant problems with such existing procedures, however. For example:

Time: Conventional track testing takes a significant amount of time for personnel to set up test equipment and walk the tracks Logistics: Track access is restricted to non-operating hours which often provides a window of only several hours (1-2 hours) of actual available working time. Track access is also highly controlled with respect to different groups of personnel requiring physical access to the same area. Leakage current testing is commonly cancelled at the last minute.

Technical: The conventional track testing procedures currently in place provide highly-varying non-repeatable results. The procedure is highly dependent on the specific point where testing is conducted (i.e., the influence of a nearby storage yard results in no viable data). Conventional procedures do not produce an output data on which it is suitable to make engineering decisions to mitigate current leaks in a rail system. Conventional procedures also typically attempt to detect if leakage currents exist within area portion of a rail system generally, but does not provide any indication of the exact location within the rail system, or the extent of the leakage. Indeed, the tested section of a track typically varies from 300 m to 1500 m long, and the exact location of the leakage point cannot be identified using conventional systems and methods.

BRIEF DESCRIPTION OF THE FIGURES

FIG. 5 shows perspective view a flux concentrator positioned over a rail, the flux concentrator for detecting leakage current in the rail according to an embodiment of the invention.

DETAILED DESCRIPTION

Figure 1:
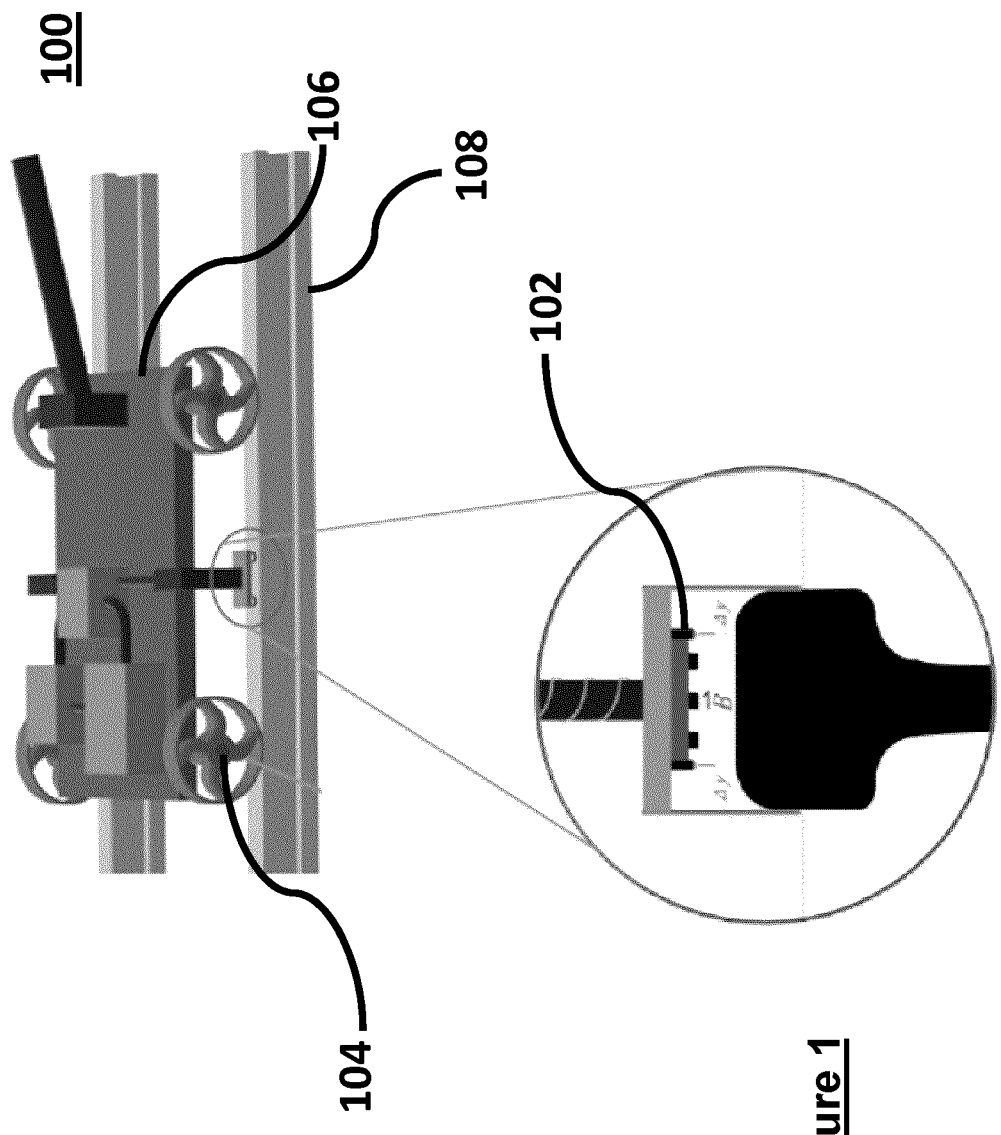
FIG. 1 shows an electromagnetic sensor mounted on a rail vehicle having a position sensor according to an embodiment of the invention.

The invention of the present disclosure is for an electric railway current leak detection device, system, and method. The device, system, and method help determine the location of leakage currents in an electric railway system. There may be a number of different causes of a current leak in an electric railway system. Leaks may be localized, for example by conductive material contacting the rail (e.g. wet material touching rail, or other conductive material touching the rails), or the leak may be distributed, for example as a result of conductive dust across an area of the electric railway system.

In an embodiment of the invention, the system, device and method use a rail instrument, such as non-invasive electromagnetic sensor, to measure electrical and/or magnetic properties concerning the traction power rail(s) and identify a current leak based on those measurements. A traction power rail may be any rail forming part of a traction power system, including the running rails used to support and guide a vehicle, the negative return rail, which may or may not be a running rail, and a $3^{rd}$ or $4^{th}$ rail, which supplies power but is not a running rail. Detecting a current leak in a rail may comprise determining if there is a decrease in current at a location along the electrified rail. A current decrease may be identified by determining a change in the magnetic field at a location relative to a different or adjacent location of the rail.

In a rail system, electric current running through the rail generates a magnetic field around the rail. A leak or loss of current at a location may be determined by detecting a variation in the magnetic field at that location relative to another location in the rail such as an adjacent location. In another example, the leakage current may be detected directly.

The rail instrument may comprise an open configuration. In an open configuration, the rail instrument spans a select distance for sensing/detecting an average magnetic field across an area about a portion of the rail at a point in time. This is in contrast to a sensor which may only sense the magnetic field at a single discrete point. The area about the portion of the rail for which the magnetic field is averaged, according to an embodiment of the invention, may correspond to the distance that the rail instrument spans. The open configuration of the rail instrument may comprise a curve in the rail instrument whereby a portion of the rail instrument curves around a portion of the rail being sensed.

The instrument may be disposed on a vehicle that moves along a segment of the rail. The vehicle may be continuously moved along the segment of the rail. As the vehicle moves along the segment of the rail over a period of time, the rail instrument is used to obtain multiple magnetic field readings for different portions of that segment of the rail during the period of time. The system may identify a leakage current at a location in the segment of the rail based on the multiple magnetic field readings taken over the period of time.

The rail instrument may comprise a flux concentrator comprising a magnetic sensor and a material forming a high-permeability flux path. The magnetic sensor may comprise any one or more of a Hall effect sensor, magneto-transistor, an AMR magnetometer, a GMR magnetometer, a magnetic tunnel junction magnetometer, a Lorentz force-based MEMS sensor, an Electron Tunneling based MEMS sensor, a fluxgate magnetometer, a coil magnetic field sensor, and a SQUID magnetometer.

In another embodiment, the instrument may comprise an Rogowski-type coil in an open configuration.

The railway current leak detection device, system, and method according to this invention may be used with electrical railway systems that are comprised of one or more tracks, each with 1 or 2 negative return rails, and may include a negative reinforcing feeder (NRF). Where there are two tracks, they run in parallel. The negative return rail(s) and NRF, where present, are run in parallel along the rail right of way and are cross bonded to each other at intervals along the right of way forming a grid. The NRF is an insulated electrical cable and so leakage current from the NRF is typically rare.

Figure 2:
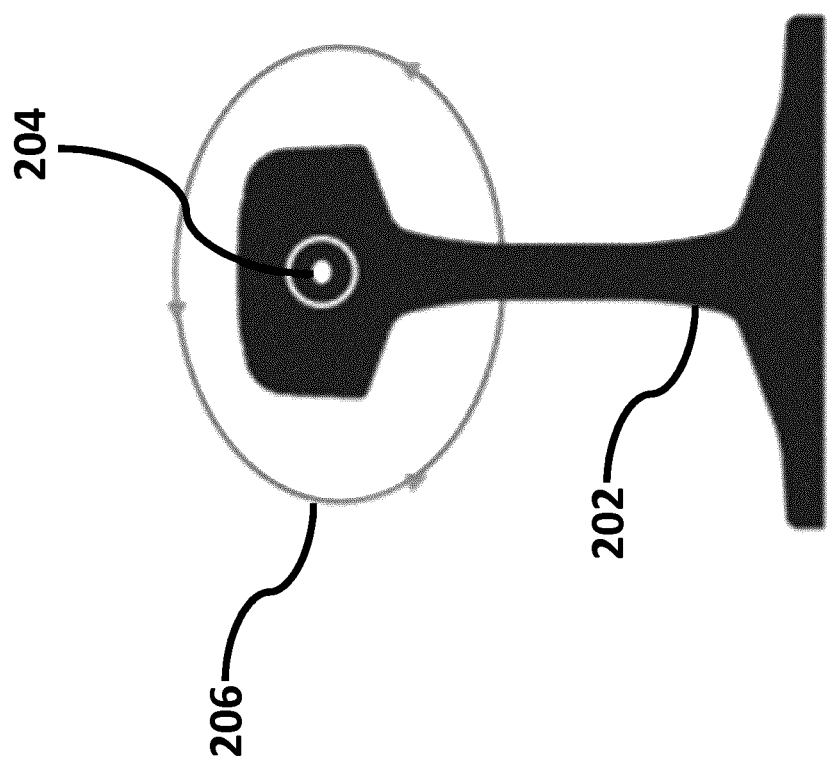
FIG. 2 shows the direction of the magnetic field relative to a current traveling out of the page.

FIG. 1 shows an embodiment of the invention, wherein the system 100 detects the electromagnetic field around a rail, and comprises a non-invasive electromagnetic field sensor 102, and a position sensor 104. The sensors may be mounted on a cart 106 that rolls on the running rails 108. The cart 106 may be a hand-pulled cart or any vehicle such as a pull cart, a hi-rail vehicle, or a train car. The cart may be powered by any means such as human-powered, gas or diesel powered, electric battery powered or electric powered via a traction power system. Leakage currents cause a change in the current on the running rails, for example, a leak may cause the magnitude of the primary current running through the rail to decrease. The change in current correlates to a change in the magnetic field in the area around the rail. A change in the detected magnetic field around the rail may be indicative of leakage of current from the rail. The position sensor 104, which may also be referred to as a chainage sensor or stationing sensor, tracks the position of the magnetic field sensor 102, such as in relation to the conductor (the rail 108). The change in magnetic flux around the rail may be correlated to the time and/or cart position data collected, thereby providing a high resolution image to help detect a stray current leak. Data analytics may be used to help identify a precise signature that is highly indicative of the location of a current leak FIG. 2 depicts a cross-section of rail 202 with an electric current 204 traveling forward through the rail (and out of the page in the representative drawing). The magnetic field 206 in this case is oriented in a counterclockwise direction around the rail.

Figure 3:
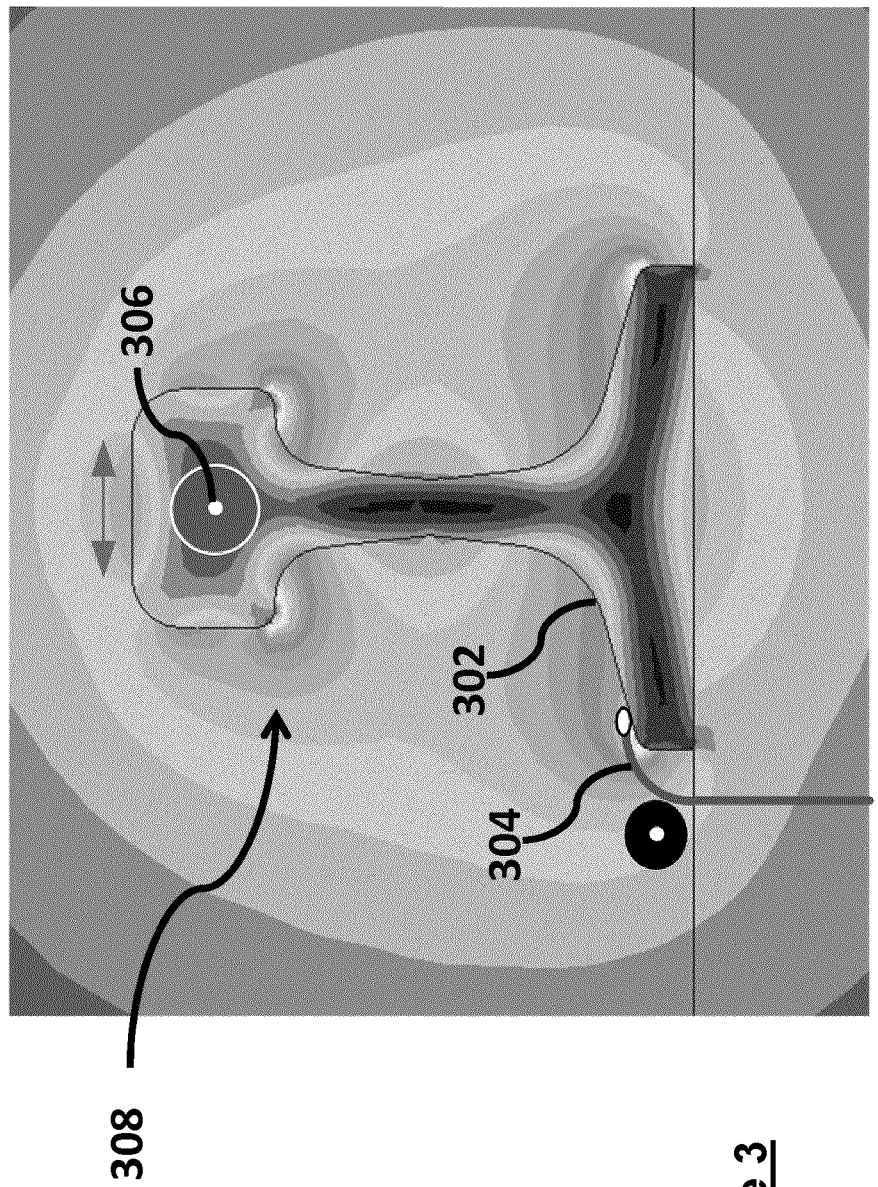
FIG. 3 shows a cross section of a representation of a rail having a current passing therethrough, the associated magnetic field, and a representation of a leak.

FIG. 3 shows a representative example of the contours and regions of magnetic fields and their intensities around the rail. The rail segment 302 is grounded with a ground line 304 as shown in the left bottom portion of the figure. The main current 306 passing through the rail is parallel to the direction of the rail. The magnetic fields 308 around the rail are linearly correlated with the current running through the rail. In an example, a baseline measurement of magnetic current around a rail with zero current running through the rail may be determined using a rail instrument, and compared to measurements taken with the same sensor when electric current is running through the rail. In another example, a known steady current may be injected into the rail causing a known magnetic field around the rail. The electric current may be injected into the rail specifically for testing for current leakage and changes/differences in the magnetic field at different points around the rail may be indicative of a leakage current. In other examples, a fluctuating current may be present in the rail, for example as a result of trains running along the rail.

One or more magnetic sensors may be used to measure the magnetic fields around a powered rail. The magnetic sensors may be Hall effect sensors. The contactless Hall effect sensor may be moved down the length of a rail taking point measurements of portions of the magnetic field around the rail. Variations in the primary current running through the rail may be determined by measuring and identifying variations in the corresponding magnetic field at one or more locations along the length of the rail. Changes in the magnetic field along the length of the rail, which may be detected by a Hall effect sensor, are linearly correlated with changes in the current running through the rail at the points of measurement. Measurements taken by a conventional Hall effect sensor however are dependent on the distance of that sensor from the rail because the magnetic gradients around a slice of rail can be relatively strong but variable. Such sensors are also negatively affected by natural magnetic grains. As such, even with no current, a significant variation in the detected magnetic field may be acquired by such Hall sensors.

Figure 4B:
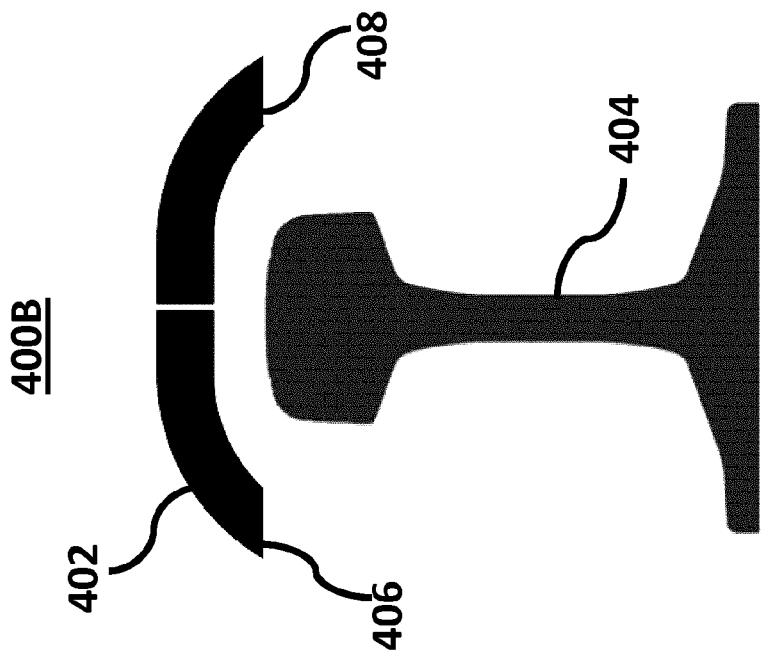
FIGS. 4A and 4B show embodiments of rail instruments for detecting magnetic field in accordance with the present invention.
Figure 4A:
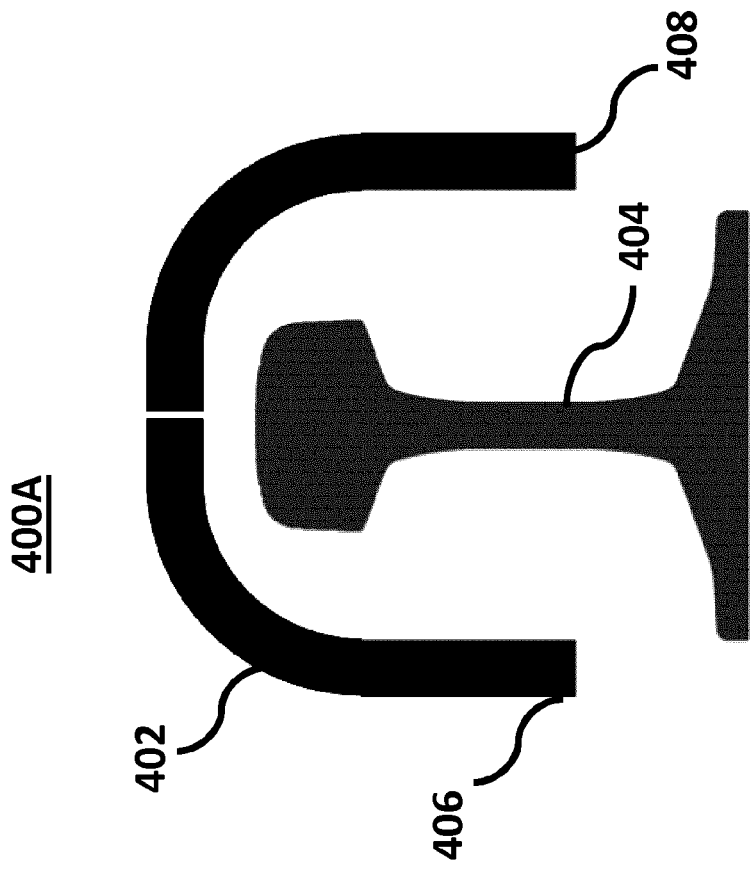

FIGS. 4A and 4B shows embodiments of a rail instrument 400A, 400B for detecting electrical or magnetic rail properties of a rail 404. The rail instrument 400A,B may be mounted to a cart such as that shown in FIG. 1. The rail instrument 400A,400B comprises an open configuration. The rail instrument 400A,B comprises an elongated conductor 402 that is configured to aggregate variations in the magnetic field across an area of the rail. The elongated conductor 402 may be disposed above the rail 404. The elongated conductor 402 may encircle a portion of the radius of the rail 404 to sense the electrical or magnetic properties of multiple faces of the rail. The elongated conductor 402 may be in a horseshoe shape. The shape of the elongated conducted 402 may be said to be in a "U" or arched configuration. Such a configuration may allow for better movement of the rail instrument along the rail.

The open portion of a "U" configuration may be positioned about the rail as shown in FIG. 4A, such that a portion of the rail 404 is positioned between the open ends of the conductor 406,408. In another example, the rail instrument may be positioned completely above the rail, such that the open ends of the "U" shaped instrument are higher in space above the top of the rail, similar to as shown in FIG. 4B. A "U" shaped metal conductor for the rail instrument may allow for improved measurement of magnetic flux about the rail while also helping avoiding contacting objects in the rail environment with the instrument while it is being passed along the rail. Having the instrument too close to the rail may results in the instrument colliding with something within the rail system environment.

The rail instrument may be formed of a single piece or multiple pieces. The rail instrument may comprise an elongated surface. For example the rail instrument may have two similar shaped pieces that come together to form an elongated surface. The elongated surface may be one or more of a planar surface and a "U" shape. Where multiple pieces are used to form the rail instrument, the pieces may be joined together without any gaps therebetween. Or as shown in FIG. 4, the pieces may be jointed together with a small gap therebetween. One or more sensors may be positioned in the middle of the rail instrument, including in the gap between two other pieces. The rail instrument may be disposed on a cart that moves along the rail such that the rail instrument detects electric or magnetic rail properties at points along the rail. The rail instrument may comprise an elongated surface, such as a planar surface, in one or more of the longitudinal direction and lateral direction in relation to the axis of the rail. An elongated surface such as a planar surface of the rail instrument may help detect all of the magnetic flux within the region along a slice of the rail that is covered by the surface of the rail instrument. This may provide measurements that are less sensitive to the natural variation of the magnetic field along a length of the rail, and may also help increase the flux density at the sensor of the rail instrument. The elongated surface may further act as a shield to external sources and can make the measurements less sensitive to the gap between the rail and the sensor (including variations in that gap as the instrument is moved along the rail). The U-shape may also help further mitigate the natural magnetic variability of the rail in the planar orientation. The elongation of the U-shape down the length of rail may similarly mitigate the natural magnetic variability of the rail in the longitudinal orientation.

The rail instrument for sensing magnetic field may comprise a magnetic flux concentrator. The magnetic flux concentrator may be in an open configuration and comprise a material with a high magnetic permeability combined with a magnetic field sensor, such as a Hall effect magnetic sensor. A magnetic flux concentrator may help provide magnetic field readings that are an average of the magnetic field of an area around a portion of the rail at a particular point in time. A reading of the average of the magnetic field around an area of a portion of the rail using the flux concentrator may be better for detecting leakage current than merely a reading of the magnetic field at a particular discrete point proximate to the rail using only a conventional Hall effect sensor. The magnetic flux concentrator is less sensitive to minor variations in the distance of the sensor from the rail as the sensor is moved along the rail over a period of time. The magnetic flux concentrator is also less sensitive to the discrete magnetic field differences between adjacent points on the rail caused by the magnetic profile of the steel rail which is an inherent property of the rail itself. Furthermore, the magnetic flux concentrator may be configured to obtain magnetic field readings from a rail which is being supplied with an AC or DC current. The magnetic flux concentrator may be configured to see multiple faces of the rail at the same time through the use of an elongated conductor that runs perpendicular to the rail itself. Alternative or in addition, the magnetic flux concentrator comprises conductors elongated in a direction that is parallel to the rail.

The magnetic flux concentrator may comprise an iron core. The iron core is a material having a greater magnetic permeability than air. The iron core may help one or more of reorient and concentrate the magnetic field across the area around the rail so that the field is focused on a specific point for detection by the magnetic sensor, such as the Hall effect magnetic sensor. An iron core may help with using the magnetic flux concentrator to obtain readings of the magnetic fields around the rail when a direct current is being injected to the rail system. The magnetic flux concentrator comprising the material with high magnetic permeability and the Hall effect sensor may be in an open configuration, for example an arch, a "U", or a horseshoe shaped configuration. Other open configurations of the magnetic flux concentrator may include, without limitation, a generally planar or flat shape, a flattened U shape resembling a C, a shallow arch, a V shape, or any other similar configuration. Such open configurations may allow the rail instrument to better envelop a portion of the rail to improve sensing of the magnetic field across a larger area around the rail, but still allowing for the instrument to be moved down the rail quickly (such as on a cart or train) to obtain many readings of a large portion of the rail over a relatively short period of time. The open configuration may be such that it materially reduces the risk of the rail instrument unwantedly contacting something while moving the instrument along the rail.

The Hall effect sensor may be positioned between two pieces of high magnetically permeable material in the flux concentrator. For example, the Hall effect sensor may be positioned at the closed end of the "U" shape between two mirror image pieces forming the remainder of the flux concentrator. In other examples, a magnetic sensor other than a Hall effect sensor may be used as part of the magnetic flux concentrator. The concentrator may also reduce the effect of the rail's magnetic profile.

The magnetic flux concentrator may be a narrow magnetic flux concentrator in one or more dimensions. For example, the concentrator may extend between about 1 mm and 5 cm along the length of the rail. The narrow concentrator may be used to capture a slice or cross-section of the magnetic flux of the rail at a given position.

In another embodiment as shown in FIG. 5, the magnetic flux concentrator 500 may be a deep magnetic flux concentrator 502 extending between about 5 cm and 100 cm along the length of the rail 504. The magnetic flux concentrator 500 comprises a first portion 502A and a second portion 502B, and a magnetic sensor 506 positioned between the first portion 502A and the second portion 502B. The deep magnetic flux concentrator 500 may be used to capture an integrated and averaged magnetic flux of an area of the rails that corresponds to the length and width of the concentrator 500 (i.e. over a continuous slices of the magnetic flux in the rail). The deep magnetic flux concentrator may provide a larger gain of the signal/current running in the rail, while helping reduce noise and the effects of magnetic inhomogeneities within the rail.

A leakage current may be detected by simultaneously running two sensors along the rail and measuring the variation in current and/or magnetic field between a first sensor in a first position, and a second sensor in a second position, the second sensor being a select distance behind the first sensor relative to the direction of travel of the sensors. The distance may be for example 3 meters, corresponding to a measuring cart or vehicle holding the sensors, up to 100 m, up to 200 m, or for example as long as the length of a train or longer (through the use of separate carts). In another example, the position of one sensor may be fixed and the second sensor may be mounted on a cart. Many sensors in series may be used. The readings from multiple sensors may be used in various combinations, depending on what data is required for detecting a leak. For example, the readings of sensors passing over the same location of a rail may be used. The readings of sensors, taken at the same time, but for different parts of the same length of rail, may be used.

In an embodiment of the present disclosure where there exists a fluctuating current through the rail, for example as a result of trains running on the rail, two sensors may be used. The two sensors may be configured such that the second sensor lags in distance behind the first sensor. The two sensors measure at least some portion of the magnetic field around the rail (the magnetic field corresponding to the current passing through the rail). The measurements may be of two points of the rail. The measurements may be at the same time. The measurements may be two points of the rail at the same time. By measuring the magnetic field of the rail at two points at the same time, a differential measurement can be acquired such that the base magnetic field (i.e. inherent from the steel rail and caused by accelerating/decelerating trains) can be identified and/or filtered and excluded. In the case of fluctuating current in the rail, if two sensors are not used, and only one sensor measures a first point followed by a second point, it will not be possible to distinguish whether the results are differences in time or differences due to a leak. In addition, by using two sensors over a greater distance, the sensors may be better able to detect distributed leaks (such as may be caused by conductive dust). In this latter case, the first sensor may be stationary while the second sensor moves along the rail. If there is a distributed leak, the measured magnetic field correlated with the rail current will gradually decrease over time as the mobile sensor moves along the rail (and as compared to the measured magnetic field from the stationary sensor). In another embodiment, the sensors may be placed on the same or separate vehicles configured to move along the rail. The measurements between the two sensors are compared and leaks are located along the rail when there is a variation between a first sensor's measurement and second sensor's measurement.

Figure 6:
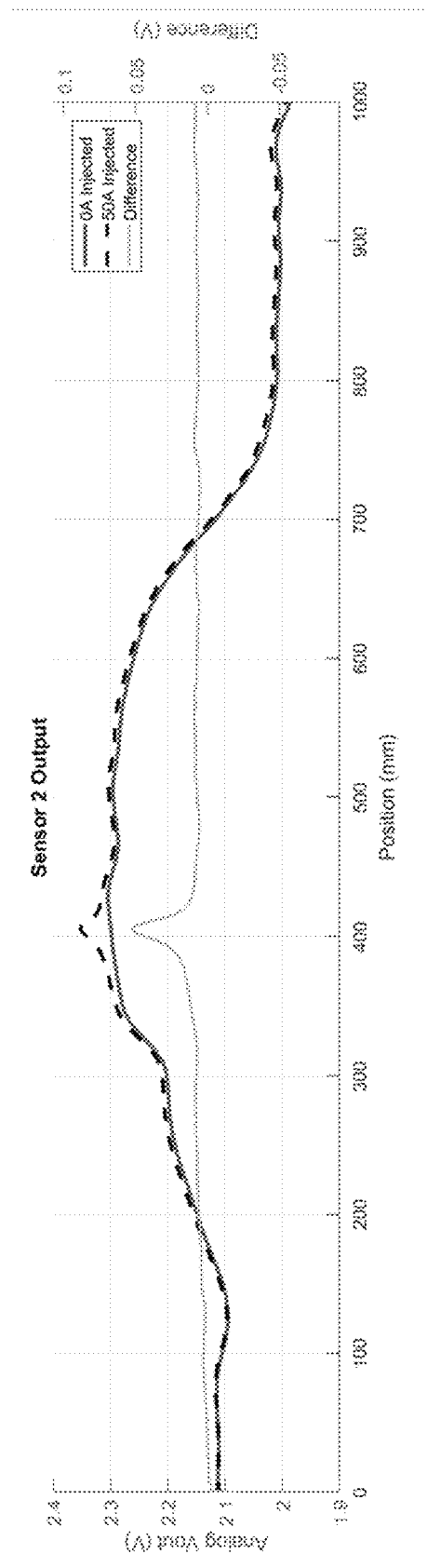
FIG. 6 shows a graph of two sets of measurements using a sensor along a section of track according to an embodiment of the invention.

FIG. 6 shows two sets of measurements, and their differential, of a sensor (as voltage output from the sensor) as it is continuously moved along a segment of a rail from positions 0 to 1000 mm according to an embodiment of the invention. In an embodiment of the present disclosure, a first set of measurements is taken with no current injected into the system (plot shown in solid black line in FIG. 6). This set of measurements identify the fluctuations in the ambient magnetic field created by the steel rail itself. Afterwards, a second set of measurements is taken of the same locations of the rail while current is flowing through the rail (for example, an injection of 50 A) (plot shown in stippled line in FIG. 6). By comparing the two sets of measurements, fluctuations in the ambient magnetic field of the rail can be identified, so as to identify and isolate the magnetic field created by the applied current and the corresponding leakage if any. A change in the magnetic field between the two sets of measurements at a particular location indicates a change in electrical current, or, a leak, for example as shown by a spike in the data at 400 mm of FIG. 6. This difference along with sensor position data determines the presence of a leak in the rail system and its location. The electromagnetic field detection system in this embodiment therefore consists of a magnetic field sensor, and a position sensor input. The sensors may be mounted for example on a vehicle (such as a cart) that rolls on the running rails in order to more easily collect a series of measurements along a section of track. However, the instruments do not need to be driven by a vehicle and may instead be used to take point measurements at specific locations in a discontinuous manner.

The system may comprise a position sensor in order to provide more accurate results. The magnetic field measurements taken of a point on the rail may be matched with the actual physical position of the rail instrument when it is taking the measurement at the point. The position sensor may continuously and precisely monitor the position of the rail instrument in relation to the rail. The position sensor may further be used to capture the sensor's location along the rail, which may be used to cross-reference the location of divergent current paths, such as cross bonds and bolted cable connections. This information can help separate the expected changes in current caused by intentional divergent current paths, from the unintentional leakage current. The position sensor accounts for fixed position conductors connected to the running rail that can change the magnitude of the magnetic field. This sensor can also relate the magnetic field data to an exact position within the traction power network.

Data analytics may help ensure a precise signature for the location of the current leak. Due to the high sensitivity of the sensors used in the system and the significant amount of influence and interference from other sources (other current-carrying conductors, vibration, other sources of current, earth's magnetic field), an advanced data analytics platform may be used to differentiate between the current leakage points on the one hand, from other factors that would produce false-positives on the other hand. The combination of a position sensor and/or data analytics with the rail instrument may help provide a precise value of the running rail current before and after a leakage point that uniquely identifies a leakage current point that will require maintenance repair.

Figure 7:
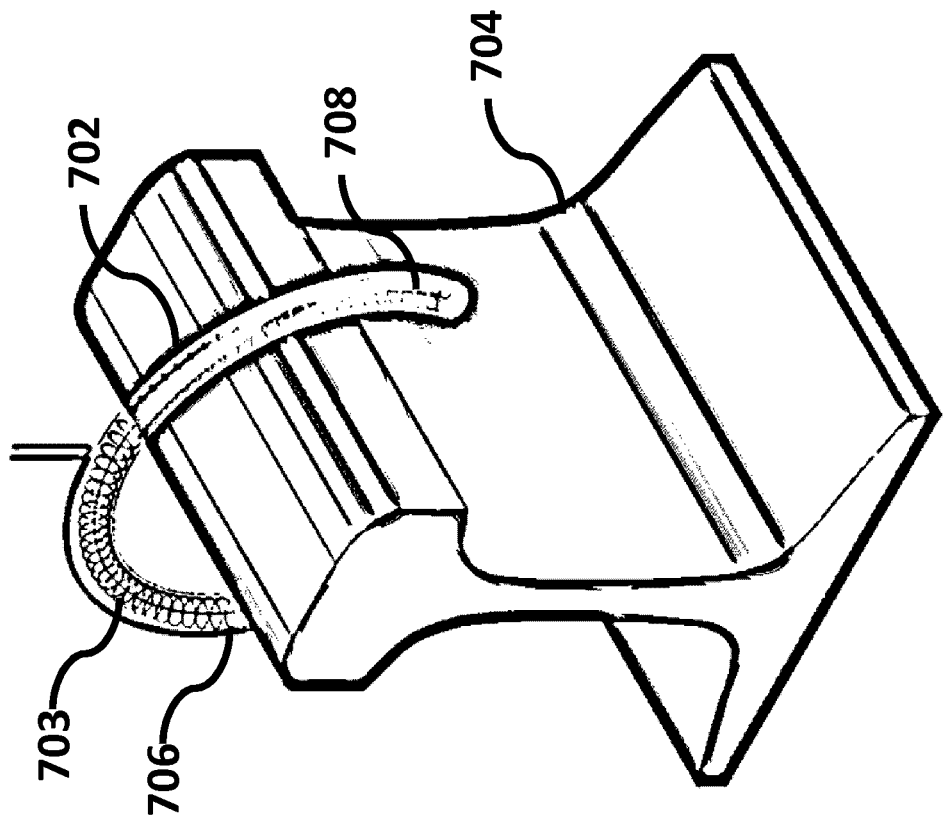
FIG. 7 shows an open configuration of a Rogowski coil with respect to an electrified track rail according to an embodiment of the invention.

In another embodiment of the system, as shown in FIG. 7, an open Rogowski-type coil 702 for measuring current along the rail 704 is used. The coil 702 comprise a partial toroid of wire 703 such that there is a first end 706 and second end 708, and the ends of the partial toroid do not meet such that a rail 704 may be passed therebetween. The open Rogowski coil infers the primary current (i.e. through the rail 704) by integration of the rate of change of the magnetic field and can be used to identify changes in the current. Specifically, the Rogowski coil 702 resolves the AC components of the electrical current as it moves along the rail. In an embodiment, the Rogowski coil 702 is in an open configuration such that it does not form a full loop (the ends 706 and 708 do not touch) as in a conventional Rogowski coil. The open Rogowski coil 702 configuration helps capture an average of a portion of the changes in the current across an area of the rail 704 rather than a single point. The ends of the open Rogowski coil do not meet to allow for the coil to partially envelope the rail. In an example, the open shaped Rogowski coil is positioned so that at least a portion of the rail is between the open ends of the coil. In this configuration, the rail passes between the ends as the coil is moved down the rail. In another example, the open shaped Rogowski coil may be positioned such that the open ends are above the rail. In an embodiment, the coil can be used at any frequency over the usable range of the instrument. In another embodiment, the output frequency spectrum derived from the coil measurements may be filtered to a specific frequency range. For example, an AC current at a specified frequency may be injected into the rail and the instrument (Rogowski coil) output may be filtered to that same frequency. When the resolved current value detected along the rail drops below a certain detection threshold this signifies the presence of a leak.

Figure 8:
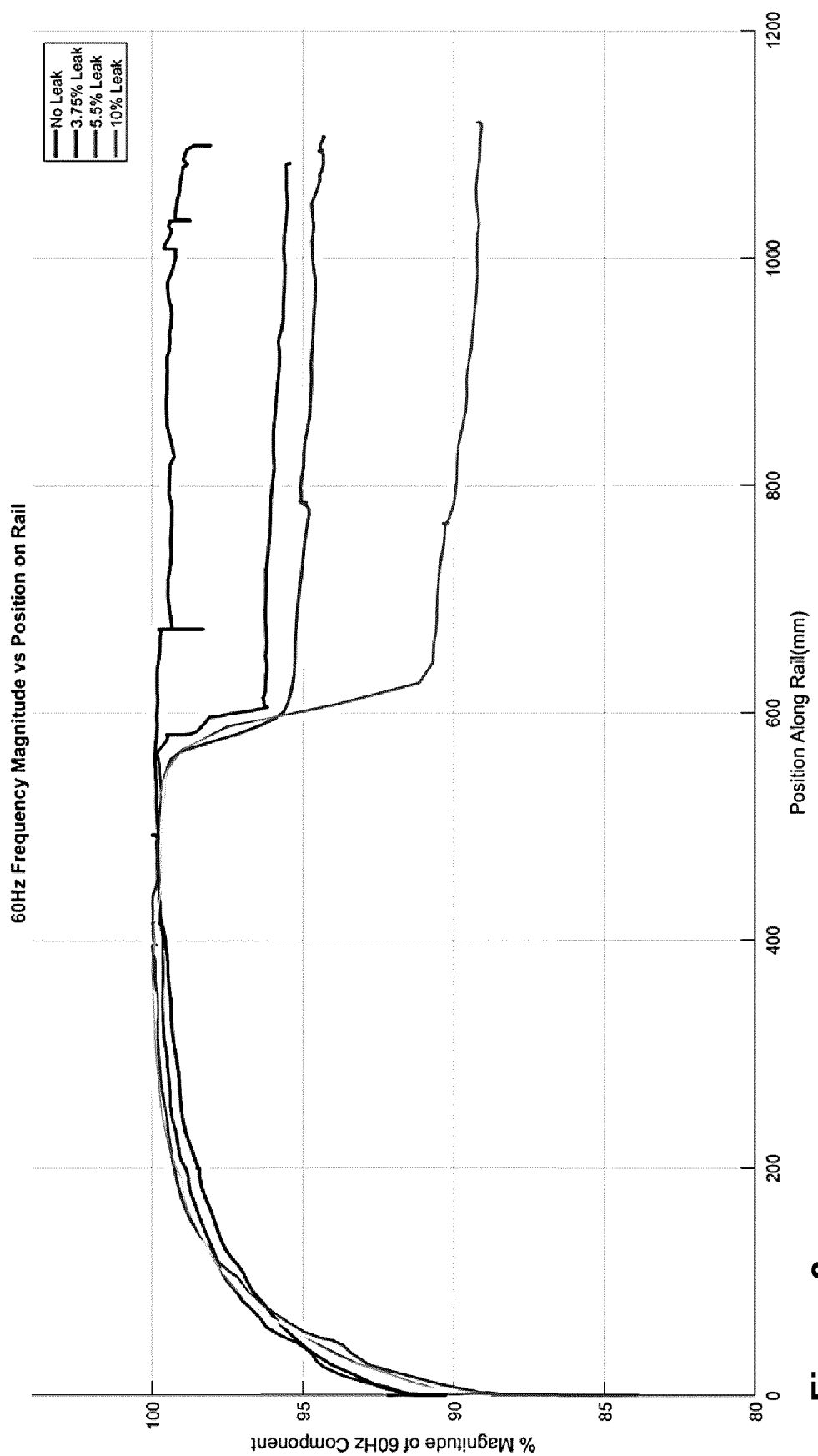
FIG. 8 shows a graph of data collected from moving a Rogowski coil along the length of an electrified track rail according to an embodiment of the invention.

As can be seen in FIG. 8, the magnitude of the current measurement inferred by the coil drops proportionally to the size/magnitude of the leak at the position of the leak (in this test at 600 mm). Each plot of FIG. 8 shows a representative example of a percentage of peak magnitude drops on the same segment of rail for different amounts of current leak. In another embodiment, two Rogowski coils are used, moving at the same speed at a predetermined distance apart. Differences in the two coil measurements indicate a change in electrical current somewhere between the two coils, thereby locating a leak between the two coils. Specifically, the two coils infer the same proportion of the current and therefore, if a first coil and a second coil detect the same proportion of current, this indicates that there is no leak. If on the other hand, one coil infers less current relative to the other coil, this indicates a leak between the coils. The use of two Rogowski coils as a detection method may help to better detect distributed current leaks.

Figure 9B:
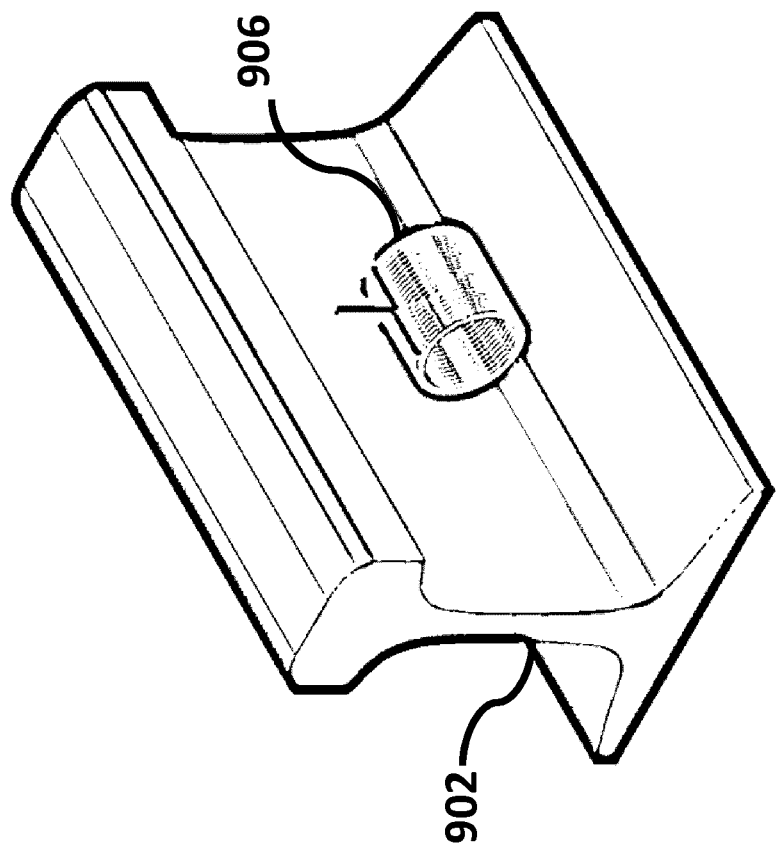
FIG. 9B shows a perspective view of magnetic coil according to an embodiment of the invention positioned adjacent to a segment of rail.
Figure 9A:
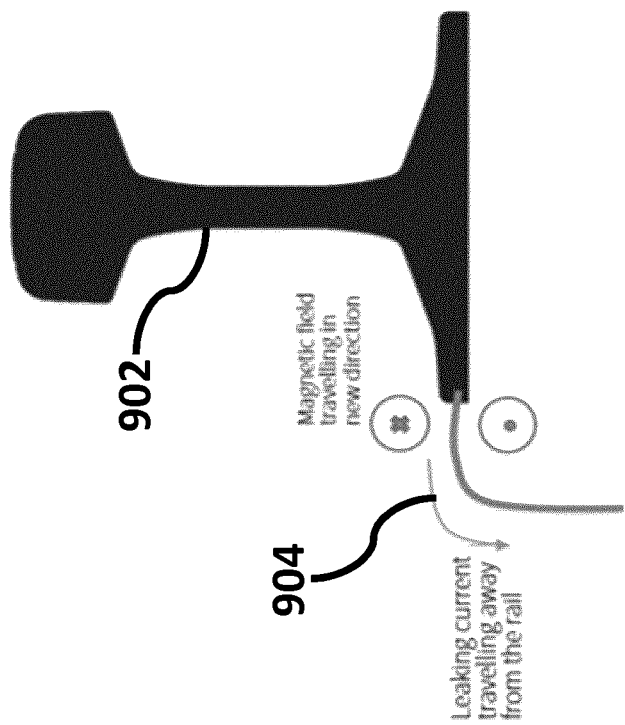
FIG. 9A shows a representation of a rail with a leakage current traveling in the vertical and horizontal direction.

FIG. 9A shows a representation of a rail 902 with a tangential leakage current 904, and FIG. 9B shows a magnetic detection coil 906 that is orthogonal to the axis of the rail 902 according to an embodiment of the invention. The magnetic coil 902 may be used to directly detect leakage current which travels in a direction other than along the length of the rai 1906. This may be tangential to or away from the rail, or orthogonal in another plane, or generally non-parallel and non-orthogonal at an angle askew to a rail. The leakage current traveling away from the rail causes the magnetic field around the leakage current to travel in a new direction that is different from the magnetic field corresponding to the primary current traveling through the rail. Leakage current 904 may flow vertically, horizontally, or in some combination thereof in any direction, but not via a path that is along the length of the rail. When using such a magnetic coil, or other electromagnetic sensor, an AC current may be injected into the rail while the sensor runs alongside the rail. The magnetic sensor ignores the longitudinal current (i.e. the current running through the rail/primary current) and only senses the tangential component of current produced from a leak. The location of a leakage current along the rail may be determined by the detected leakage current and the position of the sensor at the point of detection. In an embodiment, the coil and a series capacitor may form an LC resonant circuit at the AC injection frequency which reduces interference from AC noise in the rail and increases the sensitivity of the coil to the injection frequency.

Figure 10:
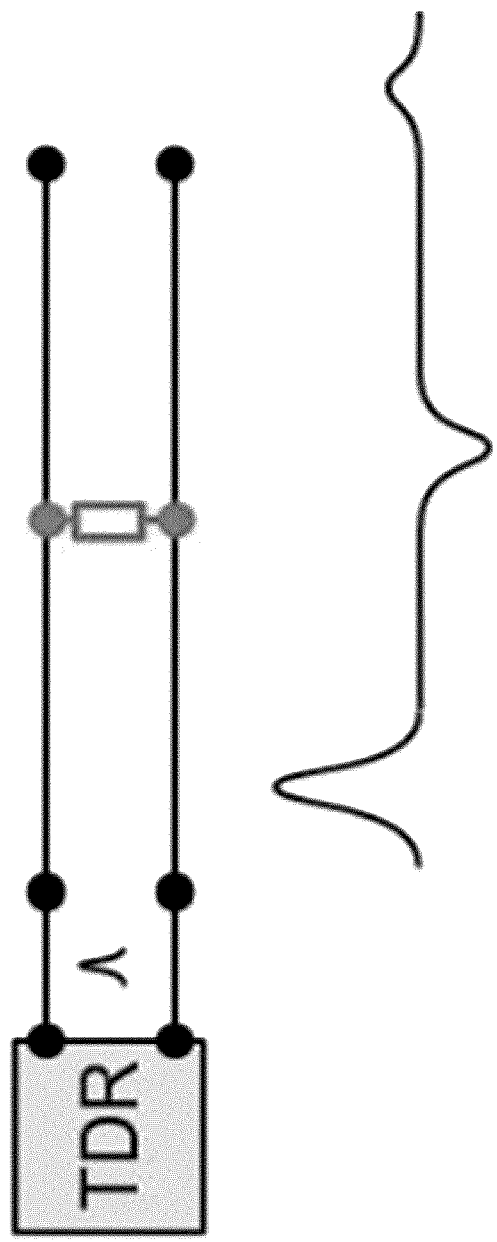
FIG. 10 shows an illustrative representation of time domain reflectometry leak detection method in a rail system with a negative pulse profile at a leakage point according to an embodiment of the invention.

In another embodiment of the system as shown in FIG. 10, leakage currents are detected by sending a pulse through the rail and detecting a reflection or discontinuity of that pulse. The reflection or discontinuity signifies the leak at the point of reflection/discontinuity. The time domain reflectometry (TDR) method comprises modeling the rail as a transmission line with a characteristic impedance. For example, a system having two parallel conductors where one conductor is the rail and the other is ground, and between the conductors is an insulating material (i.e. dielectric), a characteristic impedance may be established which can transmit a pulse down the length of the transmission line. A fast (short) voltage pulse sent into the rail reflects whenever the characteristic impedance changes. A leak will cause a change in impedance. The change in impedance, for example if there is a short or open circuit, produces a reflection which can be detected by a TDR meter. The reflection may be positive or negative depending on which way the impedance changes. A leak will generally produce a negative reflection because it is a localized induction to ground. The time of flight of the pulse, or the time between a pulse being sent out and the reflection being received can be used to determine the distance from the injection point to the leak. The measurement provides a distance from the pulse to the point of reflection. Movement closer to the leak will produce shorter distances until the position of the leak can be determined. The distance may be detected up to 100 m or up to 200 m.

Figure 11A:
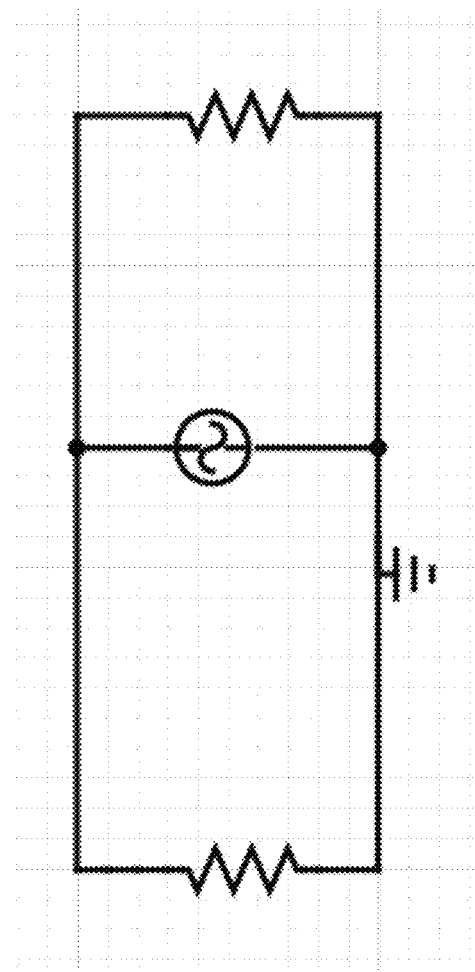
FIG. 11A shows an inductive loop according to an embodiment of the invention.
Figure 11B:
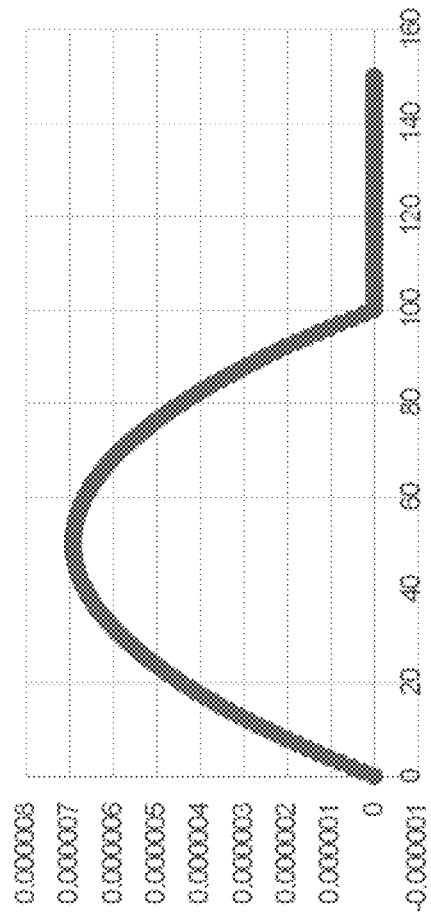
FIG. 11B shows a graph of inductance vs distance along an electrified track rail.

In another embodiment of the system as shown in FIG. 11A, a current leakage is detected through measurement of the electrical properties of the rail/conductor through inductive measurements which point to a leak. This is achieved by identifying a change in the localized magnetic properties of the rail. A loop (of wire for example) created by a conductor can be considered an inductor, and has inductance based on the loop's area. A leak in the rail causes a loop comprising: an electrode to the rail, the rail length to the leak, the leak (assumes low resistance to ground), the ground return path, and, a connection to ground. At any point in time, the coil of wire moving along the rail will be between two leakage points. As the loop moves closer to a leak, the inductance value drops and reaches a local minimum. As the loop moves away from the leak, the inductance increases. These local minimums signifying leaks can be seen in the graph of FIG. 11B. Leaks may therefore form parallel loops. An LCR meter may be used to measure the inductance along the rail. As the distance between the measurement point and the nearest leak changes, the loop area changes, affecting the measured inductance. The location of the two nearest leaks can be determined by the measured inductance. The measured inductance will go to zero (local minimum) at the location of the leaks.

Any embodiment of the electromagnetic field detection system may be used independently or in combination with any one or more of the other embodiments of the system.

We claim:

1. A system for locating current leakage in a traction power rail, the system comprising:
   a vehicle configured to move along a segment of the rail and provide a location of the vehicle along the segment of the rail at various points in time; and
   a rail instrument disposed on the vehicle, the rail instrument comprising a magnetic flux concentrator in an open configuration comprising an elongated conductor running in a direction that is parallel to a portion of the rail and having an arched or a U-shaped or a horseshoe-shaped cross section to obtain an average magnetic field reading of the portion of the rail, the instrument configured for taking readings of the average magnetic field across an area of portions of the segment of the rail while the vehicle moves along the segment,
   a processor for receiving the locations of the vehicle and readings from the rail instrument over a period of time and determines the location of a current leakage in the rail based on the locations of the vehicle and the rail instrument readings.

2. The system of claim 1 wherein the rail instrument comprises an open Rogowski-type coil.

3. The system of claim 2 wherein the Rogowski coil is tuned to resonate at a specified frequency or the Rogowski coil filtered to isolate a specific frequency.

4. The system of claim 1 wherein the magnetic flux concentrator comprises a material having a high magnetic permeability and a magnetic sensor.

5. The system of claim 4 wherein the material of the magnetic flux concentrator comprises two portions, the magnetic sensor disposed between the two portions of the material.

6. The system of claim 4 wherein the magnetic sensor is a Hall effect sensor, a magneto-transistor, an AMR magnetometer, a GMR magnetometer, a magnetic tunnel junction magnetometer, a Lorentz force-based MEMS sensor, an electron tunneling based MEMS sensor, a fluxgate magnetometer, a coil magnetic field sensor, or a SQUID magnetometer.

7. The system of claim 1 wherein the magnetic flux concentrator is a narrow magnetic flux concentrator or a deep magnetic flux concentrator, the flux concentrator extending a select distance in a direction parallel to a length of the traction power rail.

8. The system of claim 1, wherein the elongated conductor envelops a portion of the rail.

9. The system of claim 8, wherein the conductor comprises two ends, and at least a portion of the rail is disposed between the two ends.

10. A method for determining a current leakage along a traction power rail, the method comprising,
running a sensor having a magnetic flux concentrator along the rail, the magnetic flux concentrator in an open configuration and comprising an elongated conductor running in a direction that is parallel to a portion of the rail and having an arched or a U-shaped or a horseshoe-shaped cross section for obtaining an average magnetic field reading of the portion of the rail;
injecting a current into the rail to cause a known magnetic field around the rail;
detecting a difference between the average magnetic field reading and the known magnetic field;
determining a position of the sensor along the rail where the difference detected; and
determining the current leakage at the location along the rail based on the difference and the position.

11. The method of claim 10 wherein the sensor is a magnetic detection coil disposed orthogonal to the rail.

12. A rail instrument for detecting leakage current at points along a traction power rail, the rail instrument comprising a magnetic flux concentrator in an open configuration comprising an elongated conductor having a longitudinal axis running in a direction that is parallel to a longitudinal axis of a portion of the rail and having an arched or a U-shaped or a horseshoe-shaped cross section to obtain an average magnetic field reading of the portion of the rail.

13. The rail instrument of claim 12, wherein the magnetic flux concentrator comprises a high magnetic permeable material and a magnetic sensor.

14. The rail instrument of claim 13, wherein the magnetic sensor is disposed between two portions of the material.

15. The rail instrument of claim 13, wherein the magnetic sensor is a Hall effect sensor, a magneto-transistor, an AMR magnetometer, a GMR magnetometer, a magnetic tunnel junction magnetometer, a Lorentz force-based MEMS sensor, an electron tunneling based MEMS sensor, a fluxgate magnetometer, a coil magnetic field sensor, or a SQUID magnetometer.

16. The rail instrument of claim 12, comprising an open Rogowski-type coil.

17. A method for using a rail instrument for detecting leakage current in the power traction rail, the rail instrument comprising a magnetic flux concentrator in an open configuration comprising an elongated conductor running in a direction that is parallel to a portion of the rail and having an arched or a U-shaped or a horseshoe-shaped cross section to obtain an average magnetic field reading of the portion of the rail.

* * * * *